United States Patent
Yoshida et al.

(10) Patent No.: US 8,919,424 B2
(45) Date of Patent: Dec. 30, 2014

(54) SEMICONDUCTOR ELEMENT COOLING STRUCTURE

(75) Inventors: Tadafumi Yoshida, Nisshin (JP); Hiroshi Osada, Komaki (JP); Yutaka Yokoi, Seto (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 268 days.

(21) Appl. No.: 12/526,361

(22) PCT Filed: Feb. 4, 2008

(86) PCT No.: PCT/JP2008/052094
§ 371 (c)(1),
(2), (4) Date: Aug. 7, 2009

(87) PCT Pub. No.: WO2008/096839
PCT Pub. Date: Aug. 14, 2008

(65) Prior Publication Data
US 2010/0319876 A1 Dec. 23, 2010

(30) Foreign Application Priority Data
Feb. 8, 2007 (JP) ................................ 2007-028773

(51) Int. Cl.
| F28F 7/00 | (2006.01) |
| F28D 17/00 | (2006.01) |
| F25D 23/12 | (2006.01) |
| H05K 7/20 | (2006.01) |
| H01L 23/34 | (2006.01) |
| H01L 23/473 | (2006.01) |

(52) U.S. Cl.
CPC .............. *H01L 23/345* (2013.01); *H01L 23/34* (2013.01); *H01L 23/473* (2013.01)

USPC ....... 165/80.2; 165/80.3; 165/80.4; 165/80.5; 165/10; 62/259.3; 361/699; 257/712

(58) Field of Classification Search
CPC .......................... H01L 23/467; H01L 23/473
USPC ......... 165/80.2, 80.4, 80.3, 10; 257/712–722; 361/699

See application file for complete search history.

(56) References Cited

U.S. PATENT DOCUMENTS 4,559,580 A * 12/1985 Lutfy .............................. 361/689
5,455,458 A    10/1995 Quon et al.
(Continued)

FOREIGN PATENT DOCUMENTS

DE    103 47 518 A1    5/2005
JP    61-007378 A    1/1986
(Continued)

OTHER PUBLICATIONS

Machine Translation of JP 2003-142864 by Shigeo Ohashi et al., Electronic Device, May 16, 2003, PAJ, all.*

(Continued)

*Primary Examiner* — Allen Flanigan
*Assistant Examiner* — Filip Zec
(74) *Attorney, Agent, or Firm* — Sughrue Mion, PLLC

(57) ABSTRACT

A semiconductor element cooling structure includes a semiconductor element, a heat sink on which the semiconductor element is mounted, and a heat storage member attached to the semiconductor element in a manner to be located opposite to the heat sink with respect to the semiconductor element and having a case and a latent heat storage material.

4 Claims, 4 Drawing Sheets

(56) References Cited

U.S. PATENT DOCUMENTS

| | | | |
|---|---|---|---|
| 5,504,650 A * | 4/1996 | Katsui et al. | 361/697 |
| 5,615,735 A * | 4/1997 | Yoshida et al. | 165/80.3 |
| 5,712,765 A * | 1/1998 | Lehrmann et al. | 361/704 |
| 5,864,466 A * | 1/1999 | Remsburg | 361/700 |
| 5,920,458 A * | 7/1999 | Azar | 361/704 |
| 6,188,578 B1 * | 2/2001 | Lin et al. | 361/717 |
| 6,282,092 B1 * | 8/2001 | Okamoto et al. | 361/704 |
| 6,297,959 B1 * | 10/2001 | Ueno et al. | 361/704 |
| 6,521,982 B1 * | 2/2003 | Crowley et al. | 257/676 |
| 6,697,257 B1 * | 2/2004 | Wolf et al. | 361/708 |
| 6,785,139 B2 * | 8/2004 | Onizuka et al. | 361/704 |
| 6,942,018 B2 * | 9/2005 | Goodson et al. | 165/80.4 |
| 7,035,105 B2 * | 4/2006 | Yamaguchi | 361/707 |
| 7,333,337 B2 * | 2/2008 | Kita | 361/710 |
| 7,365,981 B2 * | 4/2008 | Myers et al. | 361/699 |
| 7,504,720 B2 * | 3/2009 | Nakatsu et al. | 257/712 |
| 2001/0006235 A1 * | 7/2001 | Ozawa | 257/79 |
| 2002/0005272 A1 * | 1/2002 | Hirano et al. | 165/80.3 |
| 2002/0180037 A1 * | 12/2002 | Shirakawa et al. | 257/727 |
| 2004/0012064 A1 * | 1/2004 | Yoshizaki et al. | 257/448 |
| 2005/0077614 A1 | 4/2005 | Chengalva et al. | |
| 2005/0111188 A1 * | 5/2005 | Bhattacharya et al. | 361/699 |
| 2007/0215316 A1 * | 9/2007 | Saito et al. | 165/41 |

FOREIGN PATENT DOCUMENTS

| | | |
|---|---|---|
| JP | 06-011286 A | 1/1994 |
| JP | 8-148618 A | 6/1996 |
| JP | 09-223576 A | 8/1997 |
| JP | 2000-116505 A | 4/2000 |
| JP | 2002-083915 A | 3/2002 |
| JP | 2002-270765 A | 9/2002 |
| JP | 2003142864 A | 5/2003 |
| JP | 2005-093848 A | 4/2005 |
| JP | 2005-150419 A | 6/2005 |
| JP | 2006-240501 A | 9/2006 |
| JP | 2007-019203 A | 1/2007 |
| WO | 2005/071824 A1 | 4/2005 |

OTHER PUBLICATIONS

German Office Action for corresponding German patent application No. 11 2008 000 371.8-33 dated Nov. 18, 2010.

Japanese Office Action for corresponding Japanese Patent Application No. 2007-028773 mailed Nov. 2, 2010.

* cited by examiner

SEMICONDUCTOR ELEMENT COOLING STRUCTURE

TECHNICAL FIELD

The present invention relates to a semiconductor element cooling structure and, particularly to a semiconductor element cooling structure through use of a latent heat storage material.

BACKGROUND ART

Cooling structures through use of a latent heat storage material storing heat by means of heat absorption associated with a phase change of a material have been conventionally known.

For example, Japanese Patent Laying-Open No. 2006-240501 (Patent Document 1) describes, in a cooling system for a hybrid vehicle, mixing, into a cooling medium, particles containing a latent heat storage material which undergoes a phase change at a cooling target temperature of a motor and an inverter and particles containing a latent heat storage material which undergoes a phase change at a cooling target temperature of an internal combustion engine system including the engine.

Japanese Patent Laying-Open No. 2000-116505 (Patent Document 2) describes applying a latent heat storage material to cooling of a heat-generating element of a cooker.

Japanese Patent Laying-Open No. 6-11286 (Patent Document 3) describes absorbing heat of an inverter by a heat storage material and applying the heat to space heating.

Japanese Patent Laying-Open No. 9-223576 (Patent Document 4) describes absorbing heat generated by a main circuit of a rice cooker by a heat storage material contained in a radiating fin.

Japanese Patent Laying-Open No. 61-7378 (Patent Document 5) describes specific examples of latent heat storage materials.

In a cooling structure with a semiconductor element mounted on a heat sink, cooling under normal conditions is performed by the heat sink. However, the amount of heat generated by the semiconductor element may be increased abruptly in a short time. An attempt to absorb this large amount of heat merely through use of the heat sink would cause the heat sink to have increased volume and increased heat resistance, thus raising the problem of degraded cooling performance under normal conditions. Accordingly, there is a demand for a structure that can absorb generated heat increased in a short time while preventing an increase in volume of the heat sink.

The latent heat storage material mainly utilizes heat absorption associated with a phase change of a material. For example, after the heat storage material in the solid phase melts into the liquid phase, the heat storage material cannot achieve heat absorption by latent heat until returned to the solid phase again. Therefore, the latent heat storage material is less likely to be suitable for cooling under normal conditions than the heat sink.

None of Patent Documents 1 to 5 discloses a structure with which the above problem can be sufficiently overcome. For example, Patent Document 1 merely describes mixing the latent heat storage materials into the cooling medium, but fails to describe providing separately a portion absorbing heat generated under normal conditions and a portion absorbing heat generated abruptly in a short time.

DISCLOSURE OF THE INVENTION

An object of the present invention is to provide a semiconductor element cooling structure that can absorb heat generated by a semiconductor element, even if increased abruptly in a short time, while preventing an increase in volume of a heat sink.

A semiconductor element cooling structure according to the present invention includes a semiconductor element, a heat sink on which the semiconductor element is mounted, and a heat storage member attached to the semiconductor element in a manner to be located opposite to the heat sink with respect to the semiconductor element and including a latent heat storage material.

With the above-described structure, heat generated by the semiconductor element, if increased abruptly in a short time, can be absorbed by a phase change of the latent heat storage material, while performing cooling of the semiconductor element by the heat sink under normal conditions. As a result, cooling of the semiconductor element can be improved in performance, while preventing an increase in volume of the heat sink.

Preferably, in the above-described semiconductor element cooling structure, the heat storage member includes an electrically conductive outer shell and the latent heat storage material retained in the outer shell. The semiconductor element and another component are electrically connected with the outer shell interposed therebetween.

With this structure, an electrical connection with the semiconductor element can be established through use of the outer shell of the heat storage member. This eliminates the need to arrange wiring in a manner to avoid the heat storage member, allowing the heat storage member to occupy a large area. Therefore, cooling of the semiconductor element can be improved further in performance.

Preferably, in the above-described semiconductor element cooling structure, the heat storage member is connected to another component with a heat transfer member interposed therebetween. The heat transfer member has a heat transfer coefficient higher than that of air.

With this structure, heat radiation from the heat storage member can be promoted through the heat transfer member. As a result, the heat storage member can be cooled rapidly, which enables accommodation to a continuous short-time heavy load.

Preferably, in the above-described semiconductor element cooling structure, a stress absorber capable of relaxing stress produced in the heat storage member fixed to the semiconductor element is formed in the heat storage member.

This structure can prevent an increase in stress resulting from a change in volume associated with a phase change of the latent heat storage material and from the difference in coefficient of linear expansion between the heat storage member and the semiconductor element.

By way of example, in the semiconductor element cooling structure described above, the semiconductor element is included in a controller controlling a rotating electric machine driving a vehicle.

As described above, according to the present invention, heat generated by the semiconductor element, even if increased abruptly in a short time, can be absorbed while preventing an increase in volume of the heat sink.

It is noted that two or more of the structures described above may be combined as appropriate.

BEST MODES FOR CARRYING OUT THE INVENTION

Figure 1:
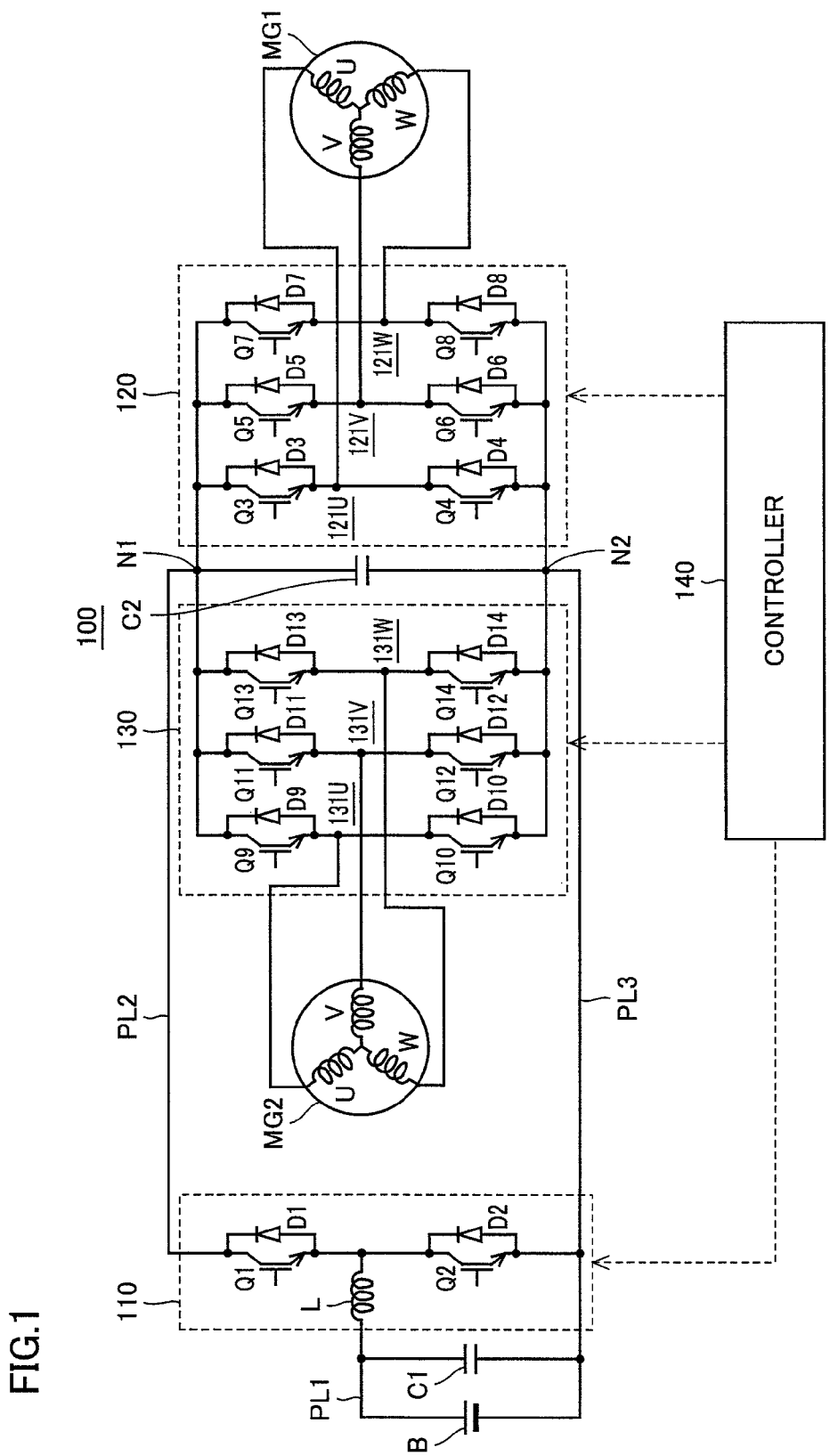
FIG. 1 is a circuit diagram showing a configuration of a main portion of a PCU to which the semiconductor element cooling structure in accordance with an embodiment of the present invention is applied.

In the following, embodiments of the present invention will be described. It is noted that the same or corresponding portions are denoted by the same reference characters, and description thereof may not be repeated.

In the embodiments described in the following, descriptions of numbers, amounts and the like are not intended to limit the scope of the invention unless otherwise specified. Further, in the embodiments below, each component is not always necessary, unless otherwise specified. When a plurality of embodiments are possible, it is naturally expected that structures of various embodiments are appropriately combined, unless otherwise specified.

FIG. 1 is a circuit diagram showing a configuration of a main portion of a PCU to which the semiconductor element cooling structure in accordance with an embodiment of the present invention is applied. It is noted that a PCU 100 shown in FIG. 1 represents a "controller for a rotating electric machine driving a vehicle."

Referring to FIG. 1, PCU 100 includes a converter 110, inverters 120 and 130, a controller 140, and capacitors C1 and C2. Converter 110 is connected between a battery B and inverters 120 and 130, and inverters 120 and 130 are connected to motor generators MG1 and MG2, respectively.

Converter 110 includes power transistors Q1 and Q2, diodes D1 and D2, and a reactor L. Power transistors Q1 and Q2 are connected in series, and each at its base, receive a control signal from controller 140. Diodes D1 and D2 are connected between the collector and emitter of power transistors Q1 and Q2, respectively, to cause current flow from the emitter side to collector side of power transistors Q1 and Q2, respectively. Reactor L has one end connected to a power line PL1 connected to a positive electrode of battery B, and the other end connected to a node between power transistors Q1 and Q2.

Converter 110 boosts DC voltage received from battery B using reactor L, and supplies the boosted voltage to a power line PL2. Further, converter 110 lowers the DC voltage received from inverters 120, 130, and with this voltage, charges battery B.

Inverters 120 and 130 include U-phase arms 121U and 131U, V-phase arms 121V and 131V, and W-phase arms 121W and 131W, respectively. U-phase arm 121U, V-phase arm 121V and W-phase arm 121W are connected in parallel between nodes N1 and N2. Similarly, U-phase arm 131U, V-phase arm 131V and W-phase arm 131W are connected in parallel between nodes N1 and N2.

U-phase arm 121U includes series-connected two power transistors Q3 and Q4. Similarly, U-phase arm 131U, V-phase arms 121V and 131V and W-phase arms 121W and 131W include series-connected two power transistors Q5 to Q14, respectively. Between the collector and emitter of each of power transistors Q3 to Q14, diodes D3 to D14, causing current flow from emitter side to collector side, are connected, respectively.

A middle point of the arm of each phase in inverters 120 and 130 is connected to an end of each phase of coils of respective phases in motor generators MG1 and MG2. Motor generators MG1 and MG2 are formed by three coils of U, V and W phases, each having one end connected commonly to a mid point.

Capacitor C1 is connected between power lines PL1 and PL3, and smoothes the voltage level of power line PL1. Further, capacitor C2 is connected between power lines PL2 and PL3, and smoothes the voltage level of power line PL2.

Inverters 120 and 130 convert a DC voltage from capacitor C2 to an AC voltage based on a drive signal from controller 140, and thereby drive motor generators MG1 and MG2.

Controller 140 calculates coil voltages of respective phases of motor generators MG1 and MG2, based on a motor torque command value, respective phase current values of motor generators MG1 and MG2, and input voltages to inverters 120 and 130, and based on the result of calculation, generates and outputs to inverters 120 and 130 a PWM (Pulse Width Modulation) signal for turning on/off power transistors Q3 to Q14.

Further, controller 140 calculates the duty ratio of power transistors Q1 and Q2 for optimizing input voltages to inverters 120 and 130 based on the motor torque command value and motor rotation number mentioned above, and based on the result of calculation, generates and outputs to converter 110 a PWM signal for turning on/off power transistors Q1 and Q2.

Further, controller 140 controls switching operations of power transistors Q1 to Q14 of converter 110 and inverters 120 and 130, in order to convert the AC power generated by motor generators MG1 and MG2 to DC power and thereby to charge battery B.

When PCU 100 operates, power transistors Q1 to Q14 and diodes D1 to D14 constituting converter 110 and inverters 120 and 130 generate heat. Therefore, it is necessary to provide a cooling structure for promoting cooling of these semiconductor elements.

Figure 2:
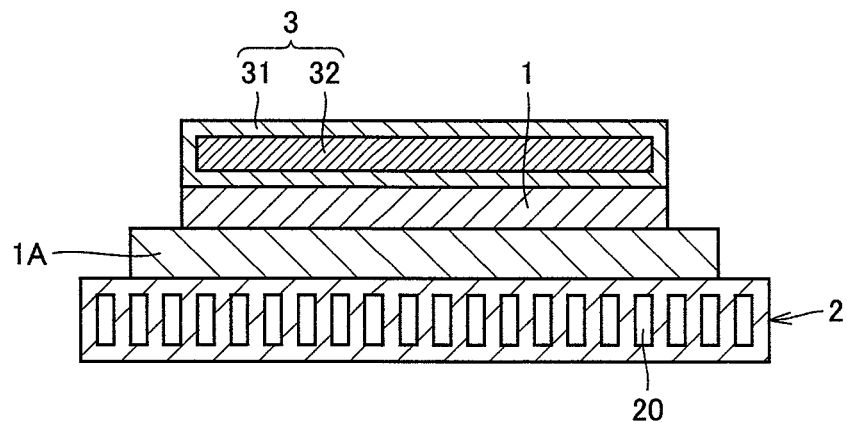
FIG. 2 is a cross-sectional view showing a semiconductor element cooling structure in accordance with an embodiment of the present invention.

FIG. 2 is a cross-sectional view showing a semiconductor element cooling structure in accordance with the present embodiment. Referring to FIG. 2, the semiconductor element cooling structure in accordance with the present embodiment is formed to include a semiconductor element 1 and a heat sink 2 on which semiconductor element 1 is mounted.

Semiconductor element 1 includes, for example, power transistors Q1 to Q14 and diodes D1 to D14 of FIG. 1. Semiconductor element 1 is mounted on heat sink 2 with a mounting structure 1A interposed therebetween. Heat sink 2 is formed of a metal having a relatively high heat transfer coefficient, such as copper or aluminum. In heat sink 2, a cooling medium channel 20 is formed. By the cooling medium caused to flow through cooling medium channel 20, cooling of semiconductor element 1 under normal conditions is achieved.

On a surface of semiconductor element 1 opposite to heat sink 2 (hereinafter referred to as a "top face"), a heat storage member 3 is fixed. Heat storage member 3 is formed to include a case 31 and a latent heat storage material 32 in case 31. Case 31 may be formed of a metal having a relatively high heat transfer coefficient and an excellent electrical conductivity, such as copper. A material constituting latent heat storage material 32 may be changed as appropriate. For example, Sn/Zn (having a melting point of 199° C.), dissolved salt NaOH—KOH (having a melting point of 170° C.) or the like may be employed. Heat storage member 3 has a thickness of about 4 mm to 5 mm, for example.

Figure 3:
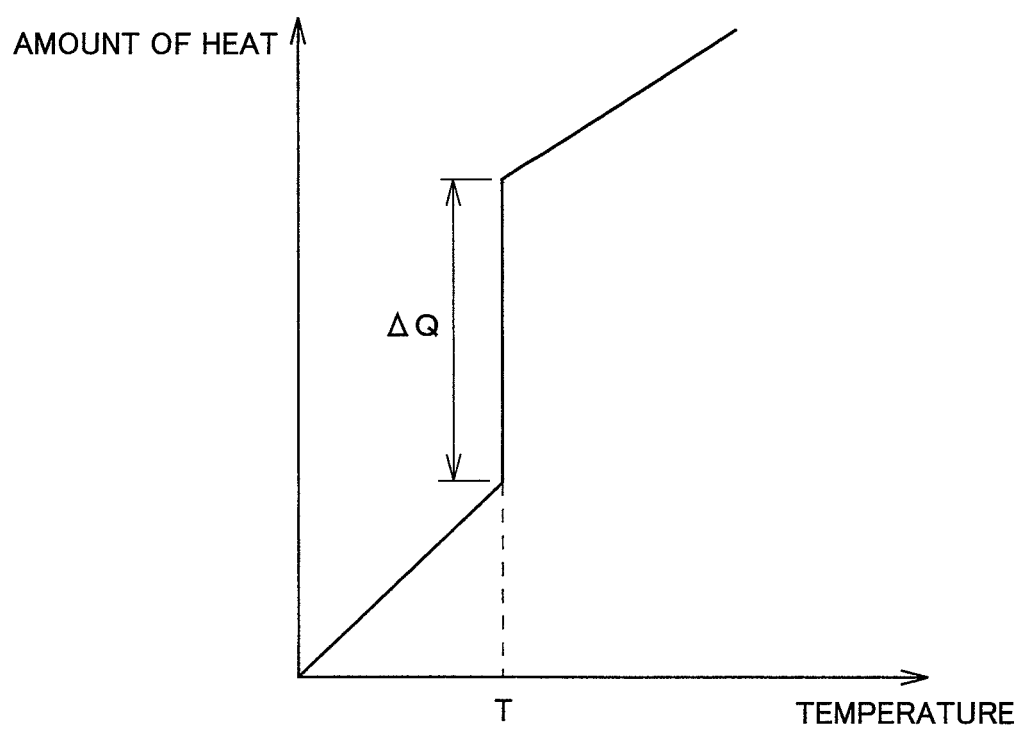
FIG. 3 is a graph describing the relation between the temperature of a latent heat storage material and the amount of heat absorbed thereto.

FIG. 3 is a graph describing the relation between the temperature of latent heat storage material 32 and the amount of heat absorbed thereto. As shown in FIG. 3, as latent heat storage material 32 absorbs heat, the temperature rises. However, when latent heat storage material 32 undergoes a phase change (herein, from the solid-phase state to the liquid-phase state) (in other words, when latent heat storage material 32 melts), a state occurs in which heat absorption (amount of heat: $\Delta Q$) takes place by means of heat of melting of latent heat storage material 32, with the temperature kept constant. In the present embodiment, a melting point T of latent heat storage material 32 is set higher than the temperature of semiconductor element 1 under normal conditions and lower than a cooling target temperature at an abnormal temperature rise of semiconductor element 1. With such setting, semiconductor element 1 is cooled mainly by heat sink 2 under normal conditions, and at the abnormal temperature rise, heat generated by semiconductor element 1 can be absorbed through use of the heat of melting of latent heat storage material 32, with heat storage member 3 kept at a constant temperature. As a result, the level of temperature rise of semiconductor element 1 can be lowered.

Modifications of the cooling structure set forth above will now be described with reference to FIGS. 4 and 5.

Figure 4:
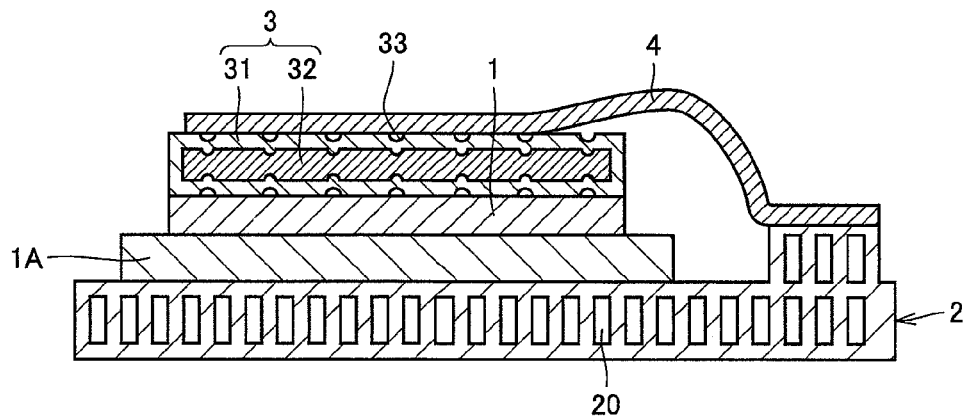
FIG. 4 is a cross-sectional view showing a modification of a semiconductor element cooling structure in accordance with an embodiment of the present invention.

In the modification shown in FIG. 4, dimples 33 are formed in the surface of case 31 of heat storage member 3. When semiconductor element 1 generates heat, stress may be produced in heat storage member 3 due to the difference in the coefficient of linear expansion between heat storage member 3 and semiconductor element 1. A change in volume of latent heat storage member 3 during a phase change may cause stress to be produced in heat storage member 3. In contrast, provision of dimples 33 as described above relaxes stress produced in heat storage member 3.

Further, in the modification shown in FIG. 4, heat storage member 3 and heat sink 2 are connected by a heat transfer sheet 4 made of a metal having a relatively high heat transfer coefficient, such as copper. Since such connection allows heat of heat storage member 3 to be escaped to heat sink 2 through heat transfer sheet 4, heat storage member 3 can be cooled rapidly, which enables accommodation to a continuous short-time heavy load.

Heat transfer sheet 4 is not limited to be made of metal, but may be made of any material having a heat transfer coefficient higher than that of air.

Figure 5:
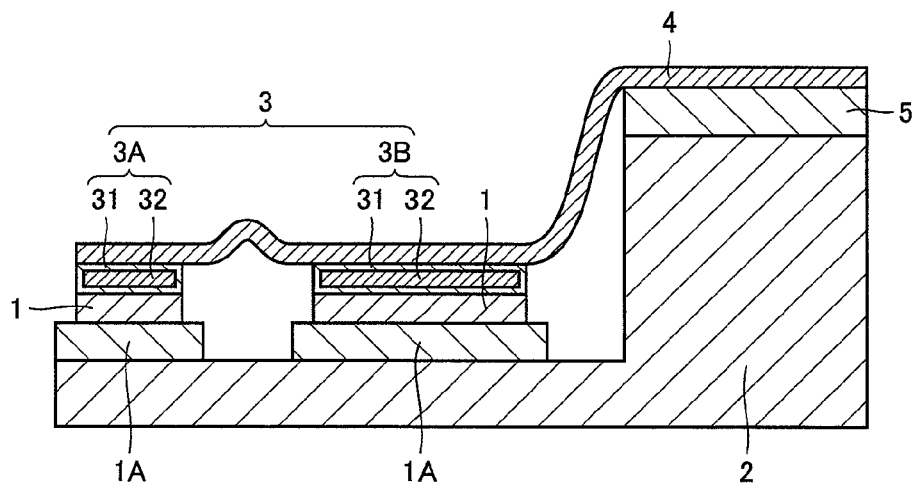
FIG. 5 is a cross-sectional view showing another modification of a semiconductor element cooling structure in accordance with an embodiment of the present invention.

In the modification shown in FIG. 5, semiconductor element 1 and a bus bar 5 are electrically connected with electrically conductive case 31 and heat transfer sheet 4 interposed therebetween. In the example of FIG. 5, two semiconductor elements 1 are provided, with a heat storage member 3A provided on the top face of one of semiconductor elements 1 and a heat storage member 3B provided on the top face of the other one of semiconductor elements 1. Heat storage members 3A, 3B and bus bar 5 are connected by heat transfer sheet 4. Herein, two semiconductor elements 1 include, for example, power transistor Q3 and diode D3 included in U-phase arm 121U. With the structure shown in FIG. 5, when electrically connecting bus bar 5 and semiconductor elements 1 by means of heat transfer sheet 4, there is no need to arrange wiring in a manner to avoid heat storage member 3 on the top face of semiconductor elements 1, which allows heat storage member 3 to occupy a large area. Therefore, cooling of semiconductor elements 1 can be improved further in performance.

Figure 6:
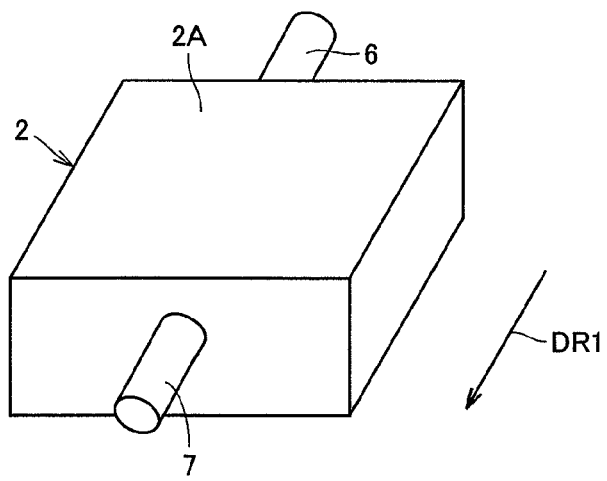
FIG. 6 is a perspective view showing a heat sink constituting the semiconductor element cooling structure in accordance with an embodiment of the present invention.
Figure 7:
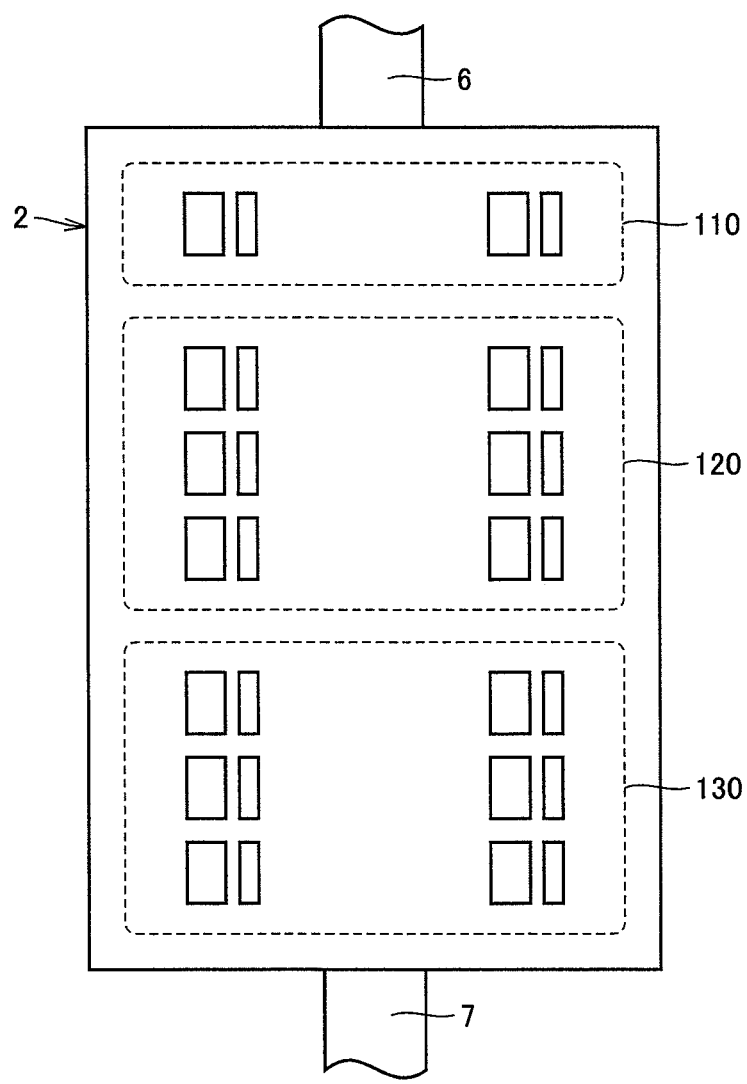
FIG. 7 is a top view showing an example of a state in which a semiconductor element is mounted on the heat sink shown in FIG. 6.

FIG. 6 is a perspective view showing the heat sink constituting the above-described cooling structure. FIG. 7 is a top view showing an example of a state in which a semiconductor element is mounted on the heat sink shown in FIG. 6. Referring to FIGS. 6 and 7, heat sink 2 has a mounting surface 2A on which semiconductor element 1 is mounted. As shown in FIG. 7, semiconductor elements 1 (power transistors Q1 to Q14 and diodes D1 to D14) included in converter 110 and inverters 120 and 130 are mounted on mounting surface 2A. Heat sink 2 includes an inlet 6 and an outlet 7. The cooling medium cooled by a radiator (not shown) is introduced from inlet 6 to heat sink 2, and flows through cooling medium channel 20 formed in heat sink 2. After flowing through cooling medium channel 20, the cooling medium is discharged through outlet 7 and guided to the radiator, to be cooled again. In this manner, cooling of semiconductor element 1 is promoted.

The contents described above will be summarized in the following. Specifically, the semiconductor element cooling structure in accordance with the present embodiment includes semiconductor element 1, heat sink 2 on which semiconductor element 1 is mounted, and heat storage member 3 attached to semiconductor element 1 in a manner to be located opposite to heat sink 2 with respect to semiconductor element 1 and having case 31 serving as an "outer shell" and latent heat storage material 32.

In the modification of FIG. 4, heat storage member 3 is connected to heat sink 2 serving as "another component" with heat transfer sheet 4 serving as a "heat transfer member" interposed therebetween.

Further, in the modification of FIG. 4, dimples 33 serving as a "stress absorber" capable of relaxing stress produced in heat storage member 3 fixed to semiconductor element 1 are formed in heat storage member 3.

In the modification of FIG. 5, semiconductor element 1 and bus bar 5 serving as "another component" are electrically connected with electrically conductive case 31 interposed therebetween.

As described above, with the semiconductor element cooling structure according to the present embodiment, heat generated by semiconductor element 1, if increased abruptly in a short time, can be absorbed by a phase change of latent heat storage member 3, while cooling of semiconductor element 1 under normal conditions is performed by heat sink 2. Therefore, cooling of semiconductor element 1 can be improved in performance, while preventing heat sink 2 from excessively increasing in size.

While the embodiments have been described here, it should be understood that the embodiments disclosed herein are illustrative and non-restrictive in every respect. The scope of the present invention is defined by the claims, and is intended to include any modification within the meaning and scope equivalent to the claims.

INDUSTRIAL APPLICABILITY

The present invention is applicable, for example, to a semiconductor element cooling structure through use of a latent heat storage material.

The invention claimed is:
1. A semiconductor element cooling structure, comprising:
a semiconductor element;

a heat sink on which said semiconductor element is mounted; and a heat storage member attached to said semiconductor element, said heat storage member comprising a latent heat storage material, wherein said latent heat storage material is located opposite to said heat sink with respect to said semiconductor element, such that said semiconductor element is sandwiched between said heat sink and said latent heat storage material; and said heat storage member further comprises a conductive case within which said latent heat storage material is retained;

a heat transfer member which connects said conductive case of said heat storage member to a bus bar disposed on said heat sink, and said heat transfer member having a heat transfer coefficient higher than a heat transfer coefficient of air;

wherein the heat sink includes an inlet and an outlet, and a cooling medium is introduced into the heat sink by the inlet and is discharged through the outlet;

said semiconductor element and said bus bar are electrically connected via said conductive case and said heat transfer member interposed between said semiconductor element and said bus bar.

2. The semiconductor element cooling structure according to claim 1, wherein a stress absorber capable of relaxing stress produced in said heat storage member fixed to said semiconductor element is formed in said heat storage member.

3. The semiconductor element cooling structure according to claim 1, wherein said semiconductor element is included in a controller controlling a rotating electric machine driving a vehicle.

4. The semiconductor element cooling structure according to claim 1, wherein the heat transfer member comprises a sheet.

* * * * *